(12) United States Patent
Laermer et al.

(10) Patent No.: US 6,217,647 B1
(45) Date of Patent: Apr. 17, 2001

(54) METHOD FOR PRODUCING A MONOCRYSTALLINE LAYER OF A CONDUCTING OR SEMICONDUCTING MATERIAL

(75) Inventors: Franz Laermer; Wilhelm Frey, both of Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/235,018

(22) Filed: Jan. 21, 1999

(30) Foreign Application Priority Data

Jan. 21, 1998 (DE) .............................. 198 02 131

(51) Int. Cl.⁷ ........................................................ C30B 1/02
(52) U.S. Cl. ..................... 117/4; 117/8; 117/9; 117/930
(58) Field of Search ................................. 117/1, 4, 8, 9, 117/930

(56) References Cited

U.S. PATENT DOCUMENTS

| | | | |
|---|---|---|---|
| 5,213,670 | 5/1993 | Bertagnolli et al. | 204/192.25 |
| 5,258,322 * | 11/1993 | Sakaguchi et al. | 437/62 |
| 5,277,748 * | 1/1994 | Sakaguchi et al. | 156/630 |
| 5,378,289 | 1/1995 | Noguchi et al. | 136/258 |
| 5,387,541 * | 2/1995 | Hodge et al. | 437/71 |
| 5,648,276 | 7/1997 | Hara et al. | 437/21 |
| 5,688,550 | 11/1997 | Weimer et al. | 427/8 |
| 5,854,123 * | 12/1998 | Sato et al. | 438/507 |
| 5,856,229 * | 1/1999 | Sakaguchi et al. | 438/406 |

FOREIGN PATENT DOCUMENTS

| | | | |
|---|---|---|---|
| 2 171 557 | 8/1986 | (GB) | H01L/21/324 |
| 2 325 542 | 11/1998 | (GB) | H01L/21/20 |
| 362245620A * | 10/1987 | (JP) | H01L/21/20 |
| 81/00789 | 3/1981 | (WO) | H01L/21/263 |

OTHER PUBLICATIONS

Wolf et al. Silicon Processing for the VLSI Era vol. 1: Process Technology, Lattice Press, Sunset Beach, CA,USA, pp. 175–182, 1986.*

* cited by examiner

Primary Examiner—Benjamin L. Utech
Assistant Examiner—Matt Anderson
(74) Attorney, Agent, or Firm—Kenyon & Kenyon

(57) ABSTRACT

To produce monocrystalline layers of conducting or semiconducting materials on porous monocrystalline layers of the same material in a reproducible and time-saving manner, a method is provided which involves applying an amorphous layer of the same material to the porous material and converting the amorphous layer to a monocrystalline layer by tempering.

22 Claims, 1 Drawing Sheet

METHOD FOR PRODUCING A MONOCRYSTALLINE LAYER OF A CONDUCTING OR SEMICONDUCTING MATERIAL

FIELD OF THE INVENTION

The present invention relates to a production of a monocrystalline layer (hereinafter referred to as a "monocrystalline material layer") of a conducting or semiconducting material (hereinafter referred to as "material") on a monocrystalline porous layer (hereinafter referred to as "porous material layer") of the same material. If the material is silicon, for example, SOI (silicon on insulator) wafers can be produced starting with such a layer structure. These wafers can be advantageously used in semiconductor electronics and in silicon micromechanics.

BACKGROUND INFORMATION

In a conventional method of producing SOI wafers, two wafers of monocrystalline silicon having at least one oxidized surface are thermally bonded to one another with the silicon dioxide surfaces and then the one wafer is thinned back.

In the SIMOX ("separation by implanted oxygen") method, oxygen ions are implanted in a monocrystalline silicon wafer, forming, after activation with silicon, a silicon dioxide layer which separates the wafer from a thin layer of silicon.

In another conventional method, silicon is deposited epitaxially on a porous monocrystalline silicon layer and then the porous silicon is oxidized.

In another conventional method, silicon is applied epitaxially to a porous, monocrystalline silicon layer, partially oxidized on its surface, after etching back.

All these conventional methods have in common the high manufacturing costs, caused by high consumption of materials or very expensive process steps, e.g., in the production of thick epitaxial layers.

SUMMARY OF THE INVENTION

An object of the present invention is to provide a simple and inexpensive method of producing monocrystalline material layers on porous monocrystalline layers of the same material in a reproducible and time-saving manner.

This object is achieved with a method according to the present invention by applying a layer of amorphous material (hereinafter referred to as "amorphous material layer") to the porous material layer and converting it to the monocrystalline material layer by a tempering procedure. Producing the monocrystalline material layer in two steps using the amorphous material layer is much less complicated and consumes much less energy than when the monocrystalline material layer is produced in one step, e.g., by epitaxy. The seeds supplied by the porous material layer, whose size is optionally (see below) reduced by oxide-masked surface areas, are sufficient to ensure complete conversion of the amorphous material to monocrystalline material. The porosity of the porous material layer is necessary in a subsequent step to permit their selective removal or selective conversion to the oxide form in the presence of the monocrystalline material layer plus optionally a wafer of the material.

It is advantageous to select the material from the group of aluminum, silicon, silicon carbide and gallium arsenide.

If the material is silicon, it is advantageously tempered at temperatures between about 600° C. and about 800°0 C. Within this temperature range, a complete conversion of the amorphous silicon to monocrystalline silicon within approximately 15 to 24 hours is ensured.

It is advantageous to surface oxidize the porous material layer superficially before applying the amorphous material layer and to thin back the surface oxidized porous material layer to the extent that the porous material is exposed again in some areas. If the porous material layer is silicon, it is especially advantageous if it is surface oxidized dry or wet at about 400° C. to 800° C. Thinning back is advantageously performed by partially dissolving with a solvent for the oxide just formed, resputtering, regrinding, plasma etching or with HCl gas in a tempering tube. Growth of the oxide layer can be controlled with these methods, and in thinning back, essentially the oxidized porous material layer is removed in the direction of the layer normal so that the oxide is removed first from elevations projecting out of the plane of the layer, and then these elevations serve as seeds in conversion to monocrystalline material in the subsequent tempering. Therefore, the monocrystalline material layer formed in tempering is in contact with the porous material only at said elevations, but not in the pores. This facilitates the subsequent removal or conversion of the porous oxide, and the levelness of the surface of the monocrystalline material layer facing the porous material layer is improved without interfering with formation of the monocrystalline material layer.

It is advantageous if the amorphous material layer is applied by sputtering onto a target plate made of the material or by LPCVD or PECVD in an atmosphere containing at least one volatile compound of the material, for example, in $SiH_4$ or di- or trichlorosilane in applying silicon. These methods are not very complicated, can be controlled well and use the conventional equipment of semiconductor manufacture.

A structure according to the present invention can be advantageously used by bonding the monocrystalline material to a carrier substrate, and then the porous material layer is dissolved away, and the bond between the monocrystalline material layer and the substrate, normally a wafer of the same material, is dissolved. Because of its structure, the solubility of the porous material layer differs so greatly from that of the wafer and the monocrystalline material layer that the latter is practically not attacked when dissolving the porous material. Instead, the monocrystalline material layer retains its original thickness and the wafer can be reused. The monocrystalline material layer has excellent electrical and mechanical properties and can therefore be used for numerous applications, such as (if the material is semiconducting) the production of high-grade thin-film electronics.

The structure including the porous material layer, the monocrystalline material layer covering it and a wafer of the same material covered by it can be advantageously used to produce a structure which, like an SOI wafer, for example, includes the wafer, an insulation layer of mainly oxidized porous material applied to it and the monocrystalline material layer; this is accomplished by exposing the structure to oxidizing conditions for a specified period of time. In order for oxidation of the porous material to be complete, a great deal of time would be required, because the oxygen would have to diffuse from the side into the porous material layer, which has a very great diameter in relation to its thickness. To obtain a good insulator, it is not generally critical if needles of porous material completely surrounded by oxide are still present. This is true in particular when the structure is subjected to a reflow step after oxidation to compress the insulator. If oxidation of the porous material is to be complete, however, it is advantageous to provide the monocrystalline material layer with a pattern of through openings before oxidation, and it is especially advantageous to distribute the openings as uniformly as possible over the monocrystalline layer, there being enough tolerance so that it is not necessary to accept any problems in use of the SOI wafer, for example, because of the pattern. In oxidation of the porous material layer, the wafer and the monocrystalline material layer are not subject to any mentionable oxidative attack. If the insulator thus produced is made to collapse by reflow after oxidation, then the resulting structure not only has good insulating properties, but also has excellent mechanical and optical properties—assuming film stress is minimized. Film stress is minimal when the porous material has a porosity of approximately 50% to 60%.

DETAILED DESCRIPTION

The present invention is described below on the basis of an exemplary embodiment with the material being silicon. However, it should be understood that although the method according to the present invention has advantages when silicon is used and the structures thus produced can be advantageously used, the method according to the present invention and its embodiments are not limited to the use of silicon or to the process parameters such as temperatures indicated in the examples. Many modifications of these examples are possible within the scope of the present invention, and the structures produced from other materials can also be used advantageously within the scope of the present invention.

It should be noted that in the exemplary embodiment described below, silicon is always monocrystalline except in the amorphous silicon layer applied in a subsequent step. This property is therefore mentioned only when necessary for understanding the description.

Figure 1A:
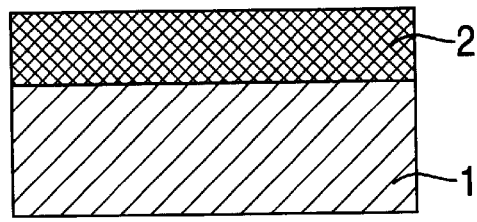
FIG. 1 a shows a schematic cross-sectional diagram of a first stage of a method according to the present invention.
FIG. 1b shows a schematic cross-sectional diagram of a second stage of the method according to the present invention.
FIG. 1c shows a schematic cross-sectional diagram of a third stage of the method according to the present invention.

FIG. 1a shows a cross section through a structure with a silicon wafer 1 and a porous silicon layer 2 applied to the wafer. Layer 2 was produced by anodizing one surface of wafer 1. This surface was exposed to a mixture containing hydrofluoric acid, water and ethanol, for example, while applying a voltage of a few volts, causing a current of less than approx. 30 mA/cm$^2$ to flow. Production of a porous silicon layer approximately 2 $\mu$m thick takes about one to three minutes. The structure of porous silicon layer 2 is such that the webs between the pores are about 2 nm to 10 nm wide, and the average pore diameter is also about 2 to 10 nm. The porous silicon layer is surface oxidized by subjecting it to dry or wet oxidation at temperatures between about 400 and 800° C., lasting between a few minutes and approximately half an hour, depending on the temperature used.

In the next step, the oxide is thinned back by immersing briefly in dilute hydrofluoric acid or dilute buffered hydrofluoric acid or by resputtering or regrinding to expose areas of the porous silicon structure. The areas which are monocrystalline have a long-range order. In principle, the surface oxidation and thinning back steps can be omitted if the layer of porous silicon is dissolved in the remaining course of the process.

Figure 1B:
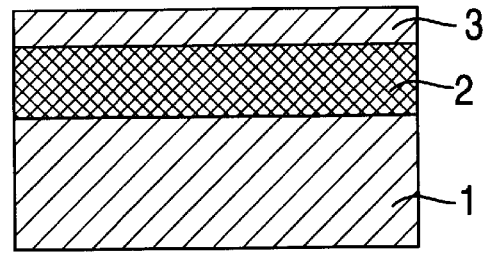

An amorphous silicon layer 3 is deposited on porous silicon layer 2 by sputtering a target plate of silicon or by LPCVD or PECVD from an SiH$_4$ vapor phase, for example (see FIG. 1b). These deposition methods are commonly used in semiconductor technology.

By tempering at temperatures less than 800° C., preferably between approx. 400° and 800° C., amorphous silicon layer 3 is converted to a monocrystalline silicon layer 4 within about 20 to 30 minutes (see FIG. 1c), with the areas of porous silicon exposed by thinning back functioning as seeds. Structure 5 then obtained can be processed further to an SOI structure or to a layer of monocrystalline silicon applied to glass, metal, polymers, etc. into which high-grade thin-film electronics can be introduced.

Figure 2A:
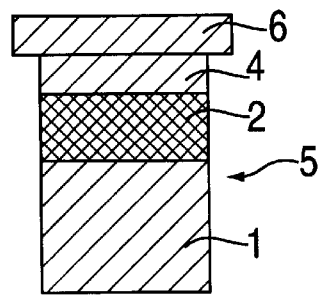
FIG. 2a shows a schematic cross-sectional diagram of a first stage in further processing of the structure shown in FIG. 1c.

To produce thin-film electronics on glass, for example (see FIG. 2a), structure 5 is anodically bonded or glued to a glass plate 6 with the exposed surface of the silicon layer, using a conventional adhesive, a photoresist or pitch, for example, as an adhesive. Then, porous silicon layer 2 is dissolved, thereby also separating layer 4 from wafer 1. If layer 2 is exclusively silicon, ammonia or dilute potassium hydroxide solution can be a suitable solvent. If the porous silicon is oxidized at the surface, it is advantageous to first remove the oxide by immersing it briefly in dilute hydrofluoric acid and only then use the solvent for silicon. Next the thin-film electronic device is created in silicon layer 4 on glass plate 6.

Figure 1C:
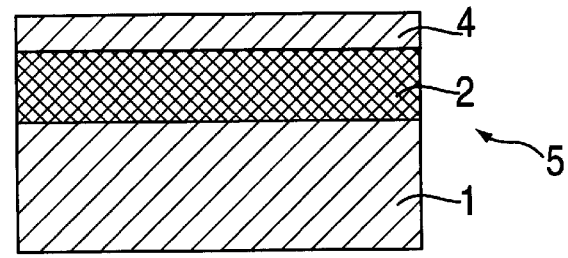
Figure 3:
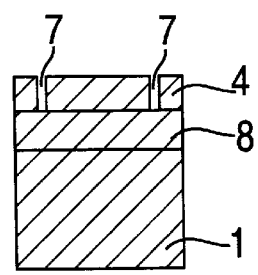
FIG. 3 shows a schematic cross-sectional diagram of a result of additional processing of the structure shown in FIG. 1c.
Figure 2B:
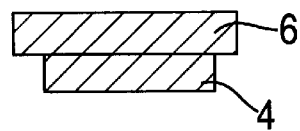
FIG. 2b shows a schematic cross-sectional diagram of a second stage in further processing of the structure shown in FIG. 1c.

To produce the SOI structure, layer 4 is first structured in the desired manner with a pattern 7 of openings extending to the porous silicon, starting from structure 5 shown in FIG. 1c, and then the porous silicon is thermally oxidized completely, as described above. As an alternative, the pattern may be omitted, and one may settle for incomplete oxidation instead, i.e., with an oxide that still contains needles of porous silicon. Finally, the structure is subjected to a heat treatment at a temperature between about 1100° C. and 1200° C. (reflow) the silicon dioxide thus produced being compressed, forming layer 8. The structure then obtained is shown in FIG. 3.

Another exemplary embodiment according to the present invention is described in greater detail below.

The method starts with a wafer of monocrystalline p-doped silicon. The wafer is clamped in an electrically insulating holder. The holder completely covered the back side of the wafer. A post electrode built into the holder contacted the back side of the wafer electrically, while the front side of the wafer is exposed. The holder is immersed in a 20% solution of hydrofluoric acid in a water-ethanol mixture. An electrode made of platinum, for example, is also immersed in the liquid. A voltage of 4.5 V is applied between the electrode and the post electrode (anode). A current with a density of 6.5 mA/cm$^2$ then flowed through the solution. Under these conditions, the silicon on the top side of the wafer is converted to porous silicon. An anodizing procedure is performed for ten minutes. A layer of porous silicon with an average thickness of about 1.2 $\mu$m is then produced. Electron microscopy reveals that the silicon webs between the pores had an average width of about 7 nm and the average pore diameter is on the order of about 5 nm. After the anodizing procedure, the wafer is removed from the holder, rinsed off, dried and then subjected to a wet thermal oxidation. Oxidation is performed at a temperature of 650° C. for 16 minutes. The exposed areas of the porous silicon are oxidized superficially. Then, the surface oxidized porous silicon layer is removed by sputtering to the extent that the porous silicon is exposed again in some areas, as confirmed by microscopic examination. A 1.5 $\mu$m thick amorphous silicon layer is applied to the thinned layer by sputtering at a pressure of $2.5 \cdot 10^{-4}$ bar, a voltage of 500 V and a power of 500 W, or in an inert atmosphere containing SiH$_4$ by standard LPCVD or by PECVD at 400° C., a pressure of $100 \cdot 10^{-3}$ bar and a power of 300 W within 30 to 60 minutes, depending on the method used. In a tempering step, the amorphous silicon is converted to a monocrystalline silicon layer at 540° C. within 24 hours.

To make the silicon layer available as an active layer on a glass substrate, the silicon layer is glued with its exposed surface to a glass plate. Pitch is used as the adhesive. Then, to remove the oxide, the wafer is immersed briefly in buffered hydrofluoric acid and next the porous silicon layer is dissolved with dilute KOH and thus the wafer is also separated from the silicon layer. The exposed surface of the silicon layer is of a very good quality, as shown by profile measurements. Four-point measurements showed that the layer has excellent electrical properties. In addition, its mechanical stability is very good. On the basis of these properties, the silicon layer is very well suited as the active layer for thin-film electronics.

The method described above is also generally applicable to other conducting and nonconducting materials, e.g., aluminum, silicon carbide and gallium arsenide, and should be adapted to the respective material accordingly.

What is claimed is:

1. A method for producing a first monocrystalline layer of a particular material, the particular material being one of a conducting material and a semi-conducting material, the method comprising the steps of:

providing a second porous monocrystalline layer composed of the particular material;

adding to the second layer a quantity of the particular material in amorphous form; and converting the amorphous material into the first monocrystalline layer using a tempering procedure.

2. The method according to claim 1, wherein the particular material includes at least one of aluminum, silicon, silicon carbide and gallium arsenide.

3. The method according to claim 1, wherein the particular material is silicon, and wherein the particular material is tempered at a temperature between approximately 600° C. and 800° C.

4. The method according to claim 1, further comprising the steps of:

before the adding step, surface oxidizing the second layer;

thinning the surface oxidized second layer to expose a porous material in at least one particular area of the second layer.

5. The method according to claim 4, wherein the particular material of the second layer is surface oxidized in one of a dry environment and a wet environment at a temperature between approximately 400° C. and 800° C.

6. The method according to claim 4, wherein the thinning step includes the substep of partially dissolving the second layer with a solvent provided for an oxide, the second layer being partially dissolved using one of a resputtering procedure, a regrinding procedure, a plasma etching procedure and a gas of HCl in a tempering tube.

7. The method according to claim 6, wherein the solvent includes one of a hydrofluoric acid and a buffered hydrofluoric acid, the solvent being provided for silicon dioxide.

8. The method according to claim 1, wherein the amorphous material is added to the second porous monocrystalline layer by one of:

sputtering a target plate composed of the particular material, and utilizing one of a LPCVD procedure and a PECVD procedure in an atmosphere containing at least one volatile compound of the particular material.

9. The method according to claim 8, wherein the volatile compound includes one of SiH$_4$, dichlorosilane and trichlorosilane.

10. The method according to claim 1, wherein the providing step includes the substep of superficially anodizing a wafer of the particular material to produce the second layer.

11. The method according to claim 10, wherein the anodizing substep includes applying a voltage in a dilute solution of a solvent to dissolve the particular material under oxidizing conditions.

12. The method according to claim 11, wherein the anodizing substep includes anodizing silicon in a solution of hydrofluoric acid in water and ethanol.

13. The method according to claim 1, further comprising the steps of:

bonding the first monocrystalline layer to a carrier substrate; and after the bonding step, dissolving a porous material of the second layer.

14. The method according to claim 13, further comprising the step of:

before the dissolving step, removing a superficial oxide layer.

15. The method according to claim 13, wherein the porous material includes a porous silicon material, and wherein the porous silicon material is dissolved with one of an ammonia and a dilute potassium hydroxide solution.

16. The method according to claim 15, further comprising the step of:

before the dissolving step, dipping the second layer in a dilute hydrofluoric acid for a time period.

17. The method according to claim 1, further comprising the step of:

after the added step, exposing the first monocrystalline layer and the second layer to an oxidizing environment for a time period.

18. The method according to claim 17, further comprising the step of:

covering the second layer with a wafer composed of the particular material, wherein the wafer is exposed to the oxidizing conditions for the time period.

19. The method according to claim 17, wherein the first monocrystalline layer includes a pattern of through openings before the first monocrystalline layer is oxidized.

20. The method according to claim 17, wherein the particular material is silicon, and wherein the particular material is oxidized in one of a wet environment and a dry environment at a temperature between approximately 400° C. and 800° C.

21. The method according to claim 17, further comprising the steps of:

at least partially converting a porous material of the second layer to a corresponding oxide material; and collapsing the corresponding oxide material by a reflow process.

22. The method according to claim 21, wherein the particular material is silicon, and further comprising the step of:

in the reflow process, heating the particular material to a temperature between approximately 1100° C. and 1200° C.

* * * * *